US010575697B2

(12) United States Patent
Imamura et al.

(10) Patent No.: US 10,575,697 B2
(45) Date of Patent: Mar. 3, 2020

(54) SUBSTRATE CLEANING APPARATUS AND SUBSTRATE PROCESSING APPARATUS

(71) Applicant: EBARA CORPORATION, Tokyo (JP)

(72) Inventors: Akira Imamura, Tokyo (JP); Junji Kunisawa, Tokyo (JP); Mitsuru Miyazaki, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 153 days.

(21) Appl. No.: 15/946,607

(22) Filed: Apr. 5, 2018

(65) Prior Publication Data

US 2018/0289230 A1    Oct. 11, 2018

(30) Foreign Application Priority Data

Apr. 7, 2017 (JP) .................................. 2017-076894

(51) Int. Cl.

| B08B 11/02 | (2006.01) |
|---|---|
| H01L 21/67 | (2006.01) |
| A47L 11/18 | (2006.01) |
| B24B 29/00 | (2006.01) |
| G05D 3/20 | (2006.01) |
| G01C 1/00 | (2006.01) |
| B24B 37/34 | (2012.01) |
| B24B 7/22 | (2006.01) |
| B24B 27/00 | (2006.01) |
| B24B 53/017 | (2012.01) |
| B24B 37/10 | (2012.01) |
| B08B 11/00 | (2006.01) |

(52) U.S. Cl.
CPC ............... *A47L 11/18* (2013.01); *B08B 11/00* (2013.01); *B08B 11/02* (2013.01); *B24B 7/228* (2013.01); *B24B 27/0023* (2013.01); *B24B 29/00* (2013.01); *B24B 37/10* (2013.01); *B24B 37/345* (2013.01); *B24B 53/017* (2013.01); *G01C 1/00* (2013.01); *G05D 3/20* (2013.01); *H01L 21/67046* (2013.01); *H01L 21/67219* (2013.01); *H01L 21/67253* (2013.01)

(58) Field of Classification Search
CPC ......... A47L 11/18; B08B 11/00; B08B 11/02; H01L 21/67046
USPC .......................... 15/77, 88.2, 88.3, 88.4, 102
See application file for complete search history.

(56) References Cited

U.S. PATENT DOCUMENTS

| 2005/0172430 A1* | 8/2005 | Yudovsky ................. B08B 1/04 15/77 |
| 2014/0041696 A1* | 2/2014 | Mori ....................... B08B 1/002 134/116 |
| 2015/0221531 A1 | 8/2015 | Tanaka |

FOREIGN PATENT DOCUMENTS

JP          2014-038983 A        2/2014

* cited by examiner

*Primary Examiner* — Randall E Chin
(74) *Attorney, Agent, or Firm* — BakerHostetler

(57) ABSTRACT

Various examples of a substrate cleaning apparatus and a substrate processing apparatus are described in the present disclosure. One example of the present invention is a substrate cleaning apparatus including a roll cleaning member cleaning a substrate, an inclination sensor detecting an inclination of the roll cleaning member, and an output device outputting a detection result of the inclination sensor.

10 Claims, 4 Drawing Sheets

SUBSTRATE CLEANING APPARATUS AND SUBSTRATE PROCESSING APPARATUS

BACKGROUND OF THE INVENTION

Field of the Invention

The present invention relates to a substrate cleaning apparatus and a substrate processing apparatus.

The present application claims priority based on Japanese Patent Application No. 2017-076894 filed on Apr. 7, 2017 in Japan, the contents of which are incorporated herein by reference.

Description of Related Art

Conventionally, as a substrate processing apparatus, a single cleaning apparatus, a surface polishing apparatus, a back surface polishing apparatus, a bevel polishing apparatus, an etching apparatus, a plating apparatus, and the like that include mechanism of cleaning a substrate are known. In addition, for example, a substrate processing apparatus described in JP 2014-038983 A is known. A substrate processing apparatus of this reference is a chemical mechanical polishing (CMP) apparatus for flatly polishing a surface of a substrate such as a silicon wafer, and includes a polishing section for polishing a substrate and a cleaning section (substrate cleaning apparatus) for cleaning the substrate.

The substrate cleaning apparatus includes a roll holder for rotating a horizontally elongated roll cleaning member, a raising and lowering mechanism for raising and lowering the roll holder, a load cell disposed between the raising and lowering mechanism and the roll holder, and a control section for feedback-controlling a roll load of the roll cleaning member based on a measurement value of the load cell.

SUMMARY OF THE INVENTION

A first aspect of the present invention is a substrate cleaning apparatus including: a substrate holding member holding a substrate; a roll cleaning member cleaning the substrate held by the substrate holding unit; an inclination sensor detecting the inclination of the roll cleaning member; and an output device outputting a detection result of the inclination sensor.

A second aspect of the present invention is the substrate cleaning apparatus according to the first aspect, in which the substrate cleaning apparatus may include, as the output device, an inclination correction device correcting the inclination of the roll cleaning member based on a detection result of the inclination sensor.

A third aspect of the present invention is the substrate cleaning apparatus according to the second aspect, including: a raising and lowering device approximating or separating the roll cleaning member with respect to the substrate, in which the inclination correction device may previously correct the inclination of the roll cleaning member such that a rotation axis of the roll cleaning member is parallel to a surface of the substrate before the raising and lowering device causes the roll cleaning member to be in contact with the substrate.

A fourth aspect of the present invention is the substrate cleaning apparatus according to the second or third aspect, including: a raising and lowering device approximating or separating the roll cleaning member with respect to the substrate; and a cleaning device cleaning the roll cleaning member, in which the inclination correction device may previously correct the inclination of the roll cleaning member such that a rotation axis of the roll cleaning member is parallel to a cleaning surface of the cleaning device before the raising and lowering device causes the roll cleaning member to be in contact with the cleaning device.

A fifth aspect of the present invention is the substrate cleaning apparatus according to any one of the second to fourth aspects, including: a raising and lowering device raising and lowering the roll cleaning member; a cleaning device cleaning the roll cleaning member; and a horizontal movement device horizontally moving the roll cleaning member between a substrate cleaning position located right above the substrate and a cleaning position located right above the cleaning device, in which the inclination correction device may previously correct the inclination of the roll cleaning member such that a rotation axis of the roll cleaning member is parallel to a horizontal plane before the horizontal movement device causes the roll cleaning member to move between the substrate cleaning position and the cleaning position.

A sixth aspect of the present invention is the substrate cleaning apparatus according to any one of the second to fifth aspects, further including: a roll holder supporting the roll cleaning member; and an arm suspending the roll holder, in which the inclination correction device may include: a tilt mechanism connecting the roll holder to the arm; and an expanding and contracting cylinder device disposed between the roll holder and the arm.

A seventh aspect of the present invention is the substrate cleaning apparatus according to the sixth aspect, in which the inclination sensor may be disposed on a straight line passing through a connection center of the tilt mechanism and orthogonal to the rotation axis of the roll cleaning member.

An eighth aspect of the present invention is the substrate cleaning apparatus according to any one of the first to seventh aspects, in which the inclination sensor may be an acceleration sensor.

A ninth aspect of the present invention is a substrate processing apparatus including: a polishing section polishing a substrate; and a cleaning section cleaning the substrate polished at the polishing section, in which the substrate processing apparatus includes, as the cleaning section, the substrate cleaning apparatus according to any one of the first to eighth aspects.

A tenth aspect of the present invention is a substrate cleaning apparatus including: a substrate holding member holding a substrate; a cleaning member cleaning the substrate held by the substrate holding unit; a cleaning member holder supporting the cleaning member; an inclination sensor detecting an inclination of the cleaning member; and an inclination correction device outputting an outputted detection result of the inclination sensor, and moving the cleaning member holder so as to correct the inclination of the roll cleaning member based on the outputted detection result of the inclination sensor.

According to the above aspects of the present invention, it is possible to provide a substrate cleaning apparatus and a substrate processing apparatus that are capable of shorten time adjusting the inclination of a roll cleaning member and to simplify an adjustment operation.

DETAILED DESCRIPTION OF THE INVENTION

Hereinafter, a substrate cleaning apparatus and a substrate transport apparatus according to one embodiment of the present invention will be described with reference to the drawings.

Figure 1:
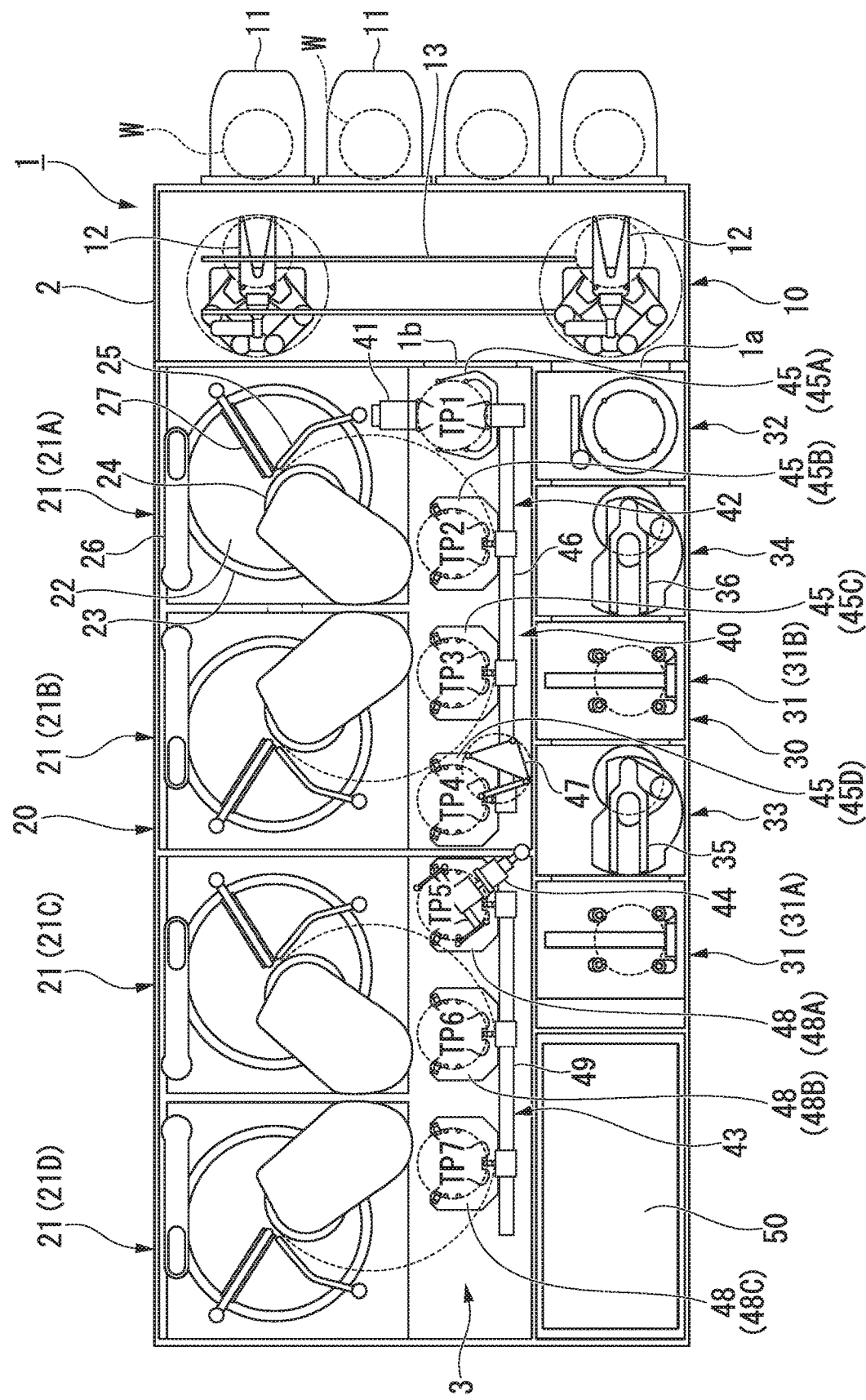
FIG. 1 is a plan view illustrating an overall configuration of a substrate processing apparatus according to one embodiment.

FIG. 1 is a plan view illustrating an overall configuration of a substrate processing apparatus 1 according to one embodiment.

The substrate processing apparatus 1 illustrated in FIG. 1 is a chemical mechanical polishing (CMP) apparatus flatly polishing a surface of a substrate W such as a silicon wafer. The substrate processing apparatus 1 includes a rectangular box-shaped housing 2. The housing 2 is formed in a substantially rectangular shape in plan view.

The housing 2 includes a substrate transport path 3 extending in a longitudinal direction at a center of the housing 2. A load and unload section 10 is disposed at one end of the substrate transport path 3 in a longitudinal direction. A polishing section 20 is disposed on one side of the substrate transport path 3 in a width direction (direction orthogonal to the longitudinal direction in plan view), and a cleaning section 30 (substrate cleaning apparatus) is disposed on the other side. In the substrate transport path 3, a substrate transport section 40 transporting the substrate W is disposed. In addition, the substrate processing apparatus 1 includes a control section 50 (control panel) comprehensively controlling the load and unload section 10, the polishing section 20, the cleaning section 30, and the substrate transport section 40.

The load and unload section 10 includes a front load unit 11 housing the substrate W. A plurality of the front load units 11 is disposed on a side surface of one end of the housing 2 in a longitudinal direction. The plurality of front load units 11 is arranged in a width direction of the housing 2. For example, the front load unit 11 includes an open cassette, a standard manufacturing interface (SMIF) pod, or a front opening unified pod (FOUP). Each of the SMIF and FOUP is an airtight container housing a cassette of the substrate W therein and covered with a partition wall and can maintain an environment independent of an external space.

In addition, the load and unload section 10 includes two transport robots 12 moving the substrate W in and out from the front load unit 11 and a traveling mechanism 13 causing each of the transport robots 12 to travel along arrangement of the front load units 11. Each of the transport robots 12 includes two hands at an upper part and a lower part and uses these hands properly before and after processing of the substrate W. For example, an upper hand is used to return the substrate W to the front load unit 11, and a lower hand is used to take out the unprocessed substrate W from the front load unit 11.

The polishing section 20 includes a plurality of polishing units 21 (21A, 21B, 21C, and 21D) polishing (flattening) the substrate W. The plurality of polishing units 21 is arranged in a longitudinal direction of the substrate transport path 3. Each of the polishing units 21 includes: a polishing table 23 rotating a polishing pad 22 having a polishing surface; a top ring 24 holding the substrate W and polishing the substrate W while pressing the substrate W against the polishing pad 22 on the polishing table 23; a polishing liquid supply nozzle 25 supplying a polishing liquid or a dressing liquid (for example, pure water) to the polishing pad 22; a dresser 26 dressing the polishing surface of the polishing pad 22; and an atomizer 27 injecting a mixed fluid of a liquid (for example, pure water) and a gas (for example, a nitrogen gas) or a liquid (for example, pure water) in a form of mist to the polishing surface.

Each of the polishing units 21 presses the substrate W against the polishing pad 22 with the top ring 24 while supplying a polishing liquid from the polishing liquid supply nozzle 25 onto the polishing pad 22, further moves the top ring 24 and the polishing table 23 relatively, and thereby polishes the substrate W to flatten a surface of the substrate W. Hard particles such as diamond particles and ceramic particles are fixed to a rotating portion at a tip in contact with the polishing pad 22, and the rotating portion is rotated and oscillated. The dresser 26 thereby dresses the entire polishing surface of the polishing pad 22 uniformly to form a flat polishing surface. By washing away polishing waste, abrasive grains, and the like remaining on the polishing surface of the polishing pad 22 with a high-pressure fluid, the atomizer 27 cleans the polishing surface and performs a dressing operation of the polishing surface by the dresser 26 as a mechanical contact, that is, regenerates the polishing surface.

The cleaning section 30 includes a plurality of cleaning units 31 (31A and 31B) cleaning the substrate W and a drying unit 32 drying the cleaned substrate W. The plurality of cleaning units 31 and the drying unit 32 (a plurality of processing units) are arranged in a longitudinal direction of the substrate transport path 3. Between the cleaning unit 31A and the cleaning unit 31B, a first transport chamber 33 is disposed. In the first transport chamber 33, a transport robot 35 transporting the substrate W among the substrate transport section 40, the cleaning unit 31A, and the cleaning unit 31B is disposed. In addition, between the cleaning unit 31B and the drying unit 32, a second transport chamber 34 is disposed. In the second transport chamber 34, a transport robot 36 transporting the substrate W between the cleaning unit 31B and the drying unit 32 is disposed.

The cleaning unit 31A includes, for example, a roll sponge type cleaning module to primarily clean the substrate W. In addition, the cleaning unit 31B also includes a roll sponge type cleaning module to secondarily clean the substrate W. The cleaning unit 31A and the cleaning unit 31B may be the same cleaning module or different cleaning modules, and may include, for example, a pencil sponge type cleaning module or a two-fluid jet type cleaning module as a cleaning module. The drying unit 32 includes, for example, a drying module performing Rotagoni drying (iso-propyl alcohol (IPA) drying). After drying, a shutter 1a disposed in a partition wall between the drying unit 32 and the load and unload section 10 is opened, and the substrate W is taken out from the drying unit 32 by the transport robot 12.

The substrate transport section 40 includes a lifter 41, a first linear transporter 42, a second linear transporter 43, and a swing transporter 44. In the substrate transport path 3, a first transport position TP1, a second transport position TP2, a third transport position TP3, a fourth transport position TP4, a fifth transport position TP5, a sixth transport position TP6, and a seventh transport position TP7 are set in order from an end where the load and unload section 10 is disposed.

The lifter 41 is a mechanism transporting the substrate W in a vertical direction at the first transport position TP1. The lifter 41 receives the substrate W from the transport robot 12 of the load and unload section 10 at the first transport position TP1. In addition, the lifter 41 delivers the substrate W received from the transport robot 12 to the first linear transporter 42. A shutter 1b is disposed on a partition wall between the first transport position TP1 and the load and unload section 10. When the substrate W is transported, the shutter 1b is opened, and the transport robot 12 delivers the substrate W to the lifter 41.

The first linear transporter 42 is a mechanism transporting the substrate W among the first transport position TP1, the second transport position TP2, the third transport position TP3, and the fourth transport position TP4. The first linear transporter 42 includes a plurality of transport hands 45 (45A, 45B, 45C, and 45D) and a linear guide mechanism 46 moving the transport hands 45 in a horizontal direction at a plurality of heights. The linear guide mechanism 46 moves the transport hand 45A between the first transport position TP1 and the fourth transport position TP4. The transport hand 45A is a pass hand receiving the substrate W from the lifter 41 and delivering the substrate W to the second linear transporter 43. The transport hand 45A does not include a raising and lowering drive section.

The linear guide mechanism 46 moves the transport hand 45B between the first transport position TP1 and the second transport position TP2. The transport hand 45B receives the substrate W from the lifter 41 at the first transport position TP1 and delivers the substrate W to the polishing unit 21A at the second transport position TP2. The transport hand 45B includes a raising and lowering drive section. When delivering the substrate W to the top ring 24 of the polishing unit 21A, the transport hand 45B is raised (approximated). After delivering the substrate W to the top ring 24, the transport hand 45B is lowered (separated). Note that each of the transport hand 45C and the transport hand 45D also includes a similar raising and lowering drive section.

The linear guide mechanism 46 moves the transport hand 45C between the first transport position TP1 and the third transport position TP3. The transport hand 45C receives the substrate W from the lifter 41 at the first transport position TP1 and delivers the substrate W to the polishing unit 21B at the third transport position TP3. In addition, the transport hand 45C is also an access hand receiving the substrate W from the top ring 24 of the polishing unit 21A at the second transport position TP2 and delivering the substrate W to the polishing unit 21B at the third transport position TP3.

The linear guide mechanism 46 moves the transport hand 45D between the second transport position TP2 and the fourth transport position TP4. The transport hand 45D is an access hand receiving the substrate W from the polishing unit 21A or the top ring 24 of the polishing unit 21B at the second transport position TP2 or the third transport position TP3 and delivering the substrate W to the swing transporter 44 at the fourth transport position TP4.

The swing transporter 44 includes a hand movable between the fourth transport position TP4 and the fifth transport position TP5 and delivers the substrate W from the first linear transporter 42 to the second linear transporter 43. In addition, the swing transporter 44 delivers the substrate W polished by the polishing section 20 to the cleaning section 30. A temporary placement stand 47 of the substrate W is disposed in a movement range of the swing transporter 44. The swing transporter 44 places the substrate W received at the fourth transport position TP4 or the fifth transport position TP5 upside down on the temporary placement stand 47. The substrate W placed on the temporary placement stand 47 is transported to the first transport chamber 33 by the transport robot 35 of the cleaning section 30.

The second linear transporter 43 is a mechanism transporting the substrate W among the fifth transport position TP5, the sixth transport position TP6, and the seventh transport position TP7. The second linear transporter 43 includes a plurality of transport hands 48 (48A, 48B, and 48C) and a linear guide mechanism 49 moving the transport hands 45 in a horizontal direction at a plurality of heights. The linear guide mechanism 49 moves the transport hand 48A between the fifth transport position TP5 and the sixth transport position TP6. The transport hand 45A is an access hand receiving the substrate W from the swing transporter 44 and delivering the substrate W to the polishing unit 21C.

The transport hand 48B moves between the sixth transport position TP6 and the seventh transport position TP7. The transport hand 48B is an access hand receiving the substrate W from the polishing unit 21C and delivering the substrate W to the polishing unit 21D. The transport hand 48C moves between the seventh transport position TP7 and the fifth transport position TP5. The transport hand 48C is an access hand receiving the substrate W from the polishing unit 21C or the top ring 24 of the polishing unit 21D at the sixth transport position TP6 or the seventh transport position TP7 and delivering the substrate W to the swing transporter 44 at the fifth transport position TP5. Incidentally, although not described, an operation of the transport hand 48 delivering the substrate W is similar to the above-described operation of the first linear transporter 42.

Figure 2:
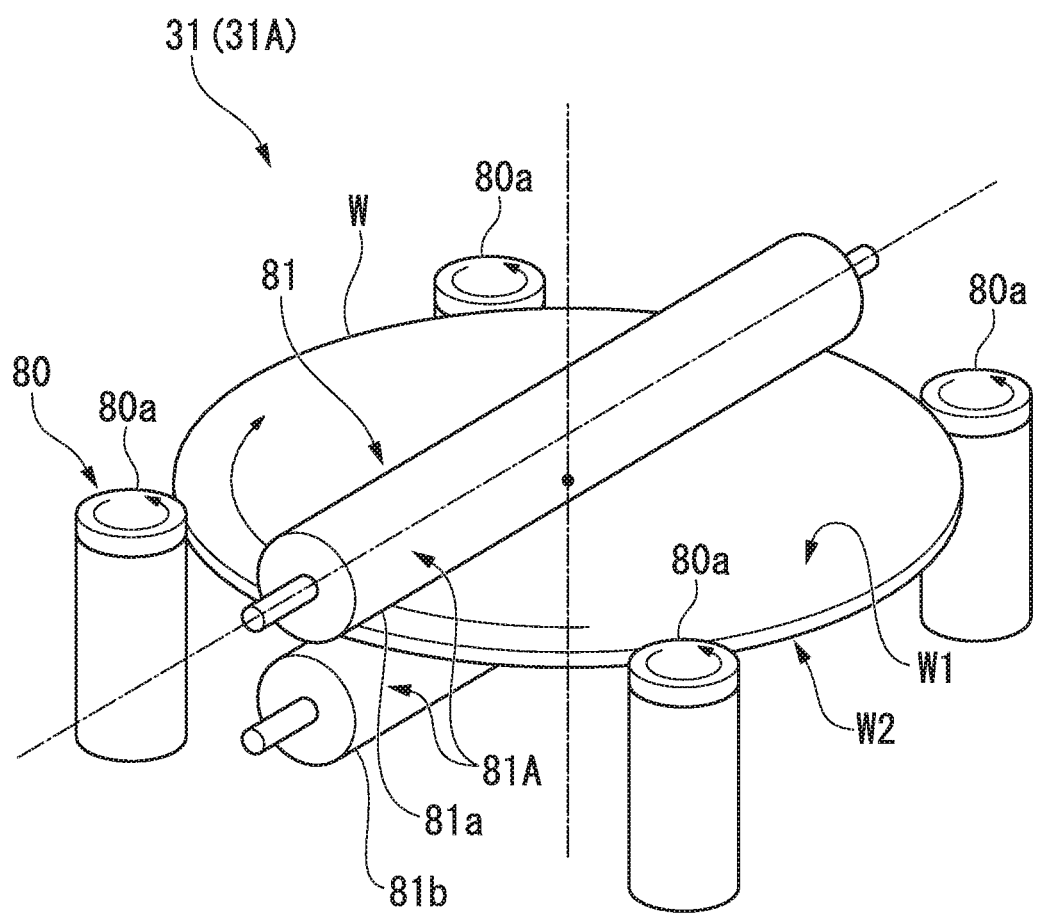
FIG. 2 is a perspective view illustrating a configuration of a cleaning unit according to one embodiment.

FIG. 2 is a perspective view illustrating a configuration of the cleaning unit 31A according to one embodiment.

The cleaning unit 31A includes, for example, a roll cleaning module as illustrated in FIG. 2. This roll cleaning module includes a rotation mechanism 80 rotating the substrate W and a roll cleaning member 81 rotating with a peripheral surface 81A in contact with the substrate W. The rotation mechanism 80 includes a plurality of holding rollers 80a holding an outer periphery of the substrate W and rotating the substrate W around an axis extending in a vertical direction. The plurality of holding rollers 80a is connected to an electric drive section such as a motor and horizontally rotates. In addition, the plurality of holding rollers 80a is movable in a vertical direction by an air drive section such as an air cylinder.

The roll cleaning member 81 includes an upper roll cleaning member 81a in contact with an upper surface W1 (polishing surface) of the substrate W, and a lower roll cleaning member 81b in contact with a lower surface W2 of the substrate W. The upper roll cleaning member 81a and the lower roll cleaning member 81b are connected to an electric drive section such as a motor and rotate. In addition, the upper roll cleaning member 81a is movable in a vertical direction by an air drive section (raising and lowering device 70 illustrated in FIG. 3 described later) such as an air cylinder. Note that the lower roll cleaning member 81b is held at a constant height.

When the substrate W is set, first, the upper roll cleaning member 81a and the plurality of holding rollers 80a are raised. Next, the substrate W is horizontally held by the plurality of raised holding rollers 80a. Thereafter, the holding rollers 80a are lowered until the lower surface W2 of the substrate W comes into contact with the lower roll cleaning member 81b. Finally, the upper roll cleaning member 81a is lowered and brought into contact with the upper surface W1 of the substrate W.

As the roll cleaning member 81, a cylindrical roll sponge extending in a horizontal direction can be used. Examples of a material of the roll sponge include a porous PVA sponge and urethane foam. The cleaning unit 31A injects at least either one of a chemical liquid and pure water from a nozzle (not illustrated) toward the upper surface W1 of the substrate W and rotates the upper roll cleaning member 81a and the lower roll cleaning member 81b with peripheral surfaces of the upper roll cleaning member 81a and the lower roll cleaning member 81b in contact with the substrate W to clean the substrate W. Examples of the chemical liquid include an ammonia/hydrogen peroxide mixed aqueous solution (SC1).

Figure 3:
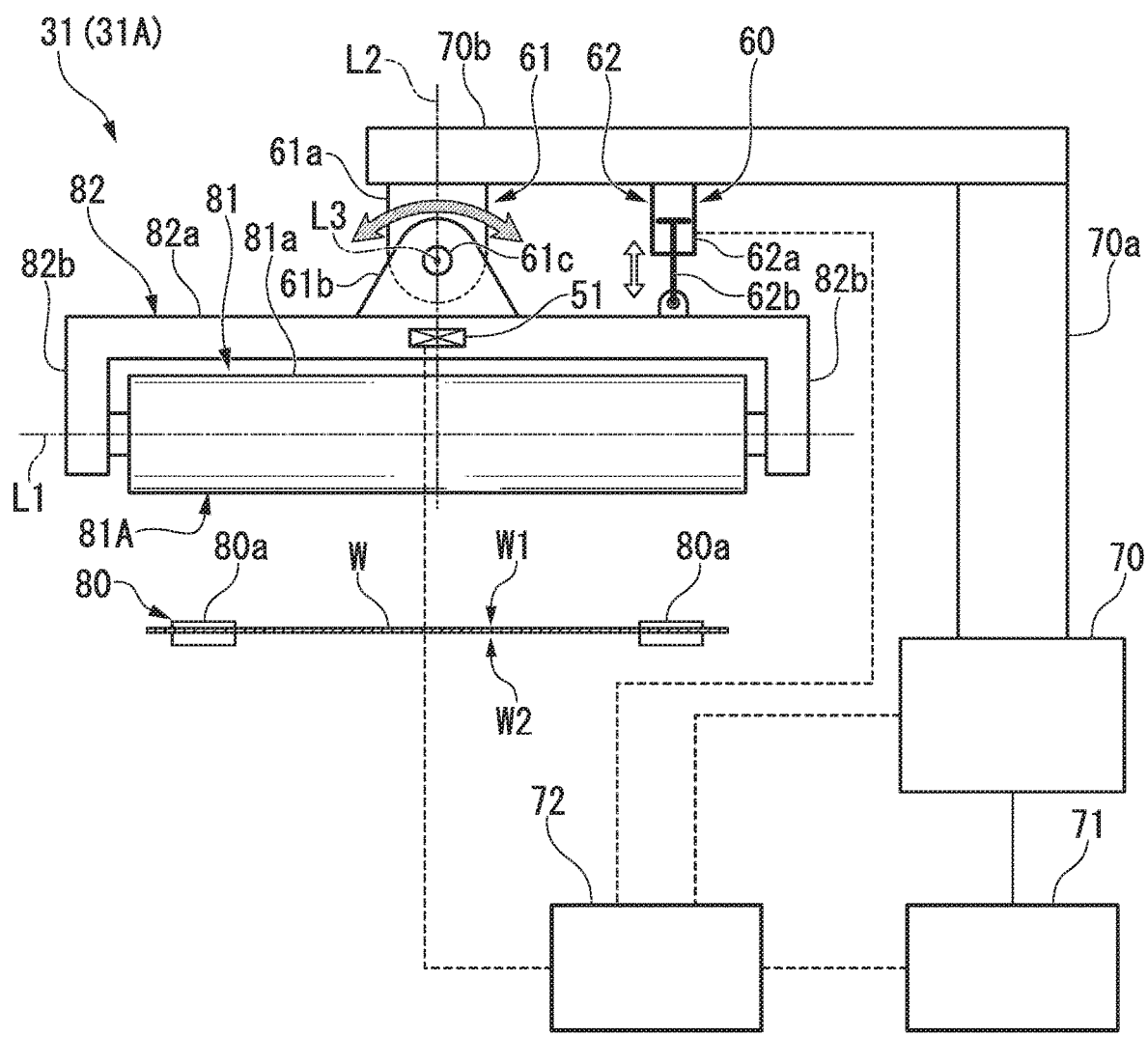
FIG. 3 is a front view illustrating a support structure of an upper roll cleaning member according to one embodiment.
Figure 4:
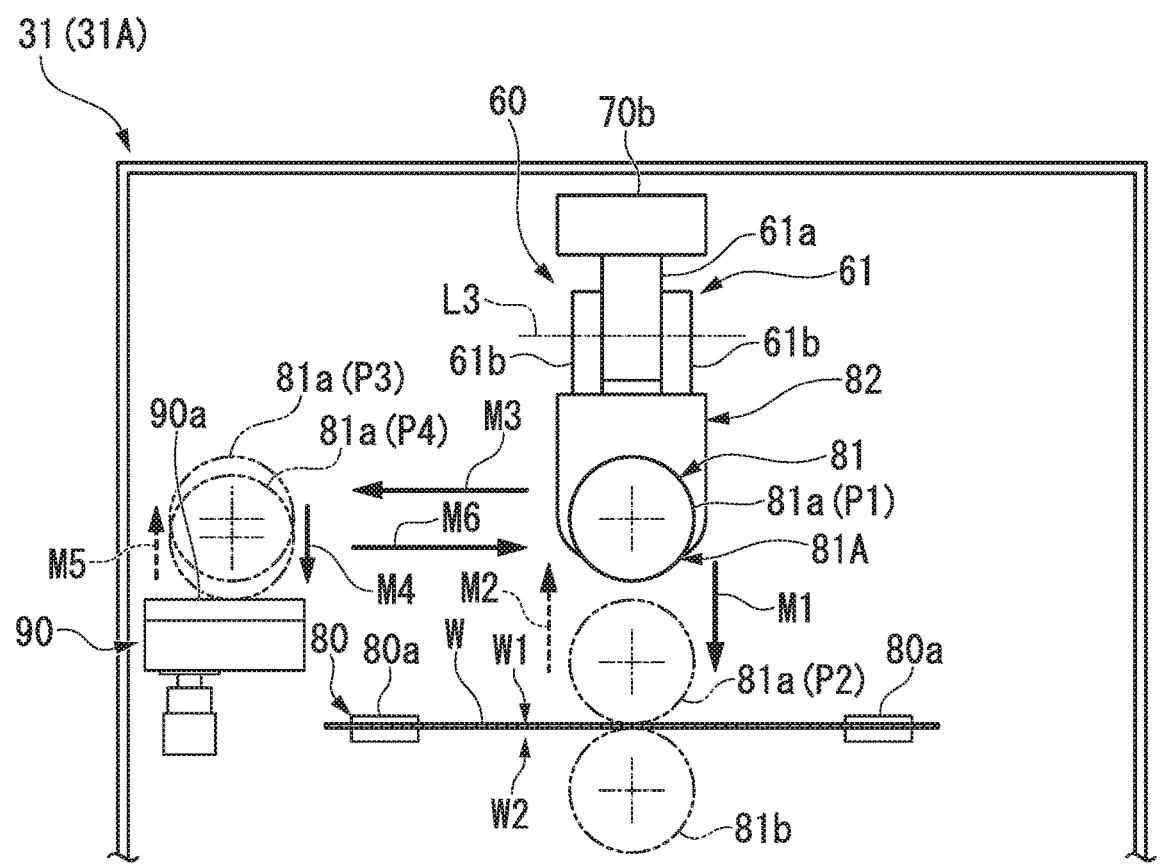
FIG. 4 is a side view illustrating movement of an upper roll cleaning member according to one embodiment.

FIG. 3 is a front view illustrating a support structure of the upper roll cleaning member 81a according to one embodiment. FIG. 4 is a side view illustrating movement of the upper roll cleaning member 81a according to one embodiment.

As illustrated in FIG. 3, the cleaning unit 31A includes a roll holder 82 supporting the upper roll cleaning member 81a so as to be rotatable around a rotation axis L1, the raising and lowering device 70 raising and lowering the roll holder 82, and a horizontal movement device 71 horizontally moving the roll holder 82.

The raising and lowering device 70 includes a raising and lowering device main body 70a that is raised and lowered by an air drive section such as an air cylinder and a raising and lowering arm 70b supported by the raising and lowering device main body 70a. The raising and lowering arm 70b horizontally extends from an upper end of the raising and lowering device main body 70a and supports the roll holder 82 at a tip thereof extending in a horizontal direction. The raising and lowering device 70 raises and lowers the roll holder 82 and the upper roll cleaning member 81a by raising and lowering the raising and lowering arm 70b by the raising and lowering device main body 70a.

The roll holder 82 includes a holder main body 82a supported by a tip of the raising and lowering arm 70b of the raising and lowering device 70 and extending in a horizontal direction, and a pair of roll support portions 82b protruding downward from both ends of the holder main body 82a in the extending direction. The roll holder 82 supports both ends of the upper roll cleaning member 81a so as to be rotatable around the rotation axis L1 with the pair of roll support portions 82b. An electric drive section such as a motor rotating and driving the upper roll cleaning member 81a is housed in an inner space of the roll holder 82.

As illustrated in FIG. 4, the horizontal movement device 71 horizontally moves the upper roll cleaning member 81a from right above the substrate W to right above a cleaning device 90. The horizontal movement device 71 is constituted by a well-known linear slider or the like. The cleaning device 90 has a cleaning surface 90a against which the upper roll cleaning member 81a is pressed. The cleaning surface 90a is formed in a planar shape, for example, by quartz. Note that the material and shape of the cleaning surface 90a may be appropriately changed according to the material and shape of the upper roll cleaning member 81a. For example, polyvinyl chloride (PVC) may be adopted as a material for forming the cleaning surface 90a.

On the cleaning surface 90a, a chemical liquid pipe, a pure water pipe, and the like (not illustrated) are disposed. Note that a chemical liquid injected from a chemical liquid pipe is preferably the same as a chemical liquid used for cleaning the substrate W in the cleaning unit 31A. In cleaning the upper roll cleaning member 81a in the cleaning device 90, dirt attached to the upper roll cleaning member 81a is removed by pressing the upper roll cleaning member 81a against the cleaning surface 90a while rotating the upper roll cleaning member 81a, and injecting a chemical liquid toward the upper roll cleaning member 81a. In this manner, the upper roll cleaning member 81a is rotated by a predetermined amount while being pressed against the cleaning surface 90a. Thereafter, the upper roll cleaning member 81a is raised and withdrawn from the cleaning surface 90a, and pure water is injected toward the cleaning surface 90a and the upper roll cleaning member 81a. As a result, dirt of the cleaning surface 90a and the upper roll cleaning member 81a can be removed.

The above-described operations of the raising and lowering device 70 and the horizontal movement device 71 are controlled by a control device 72 illustrated in FIG. 3. The control device 72 comprehensively controls an operation of the cleaning unit 31A. The control device 72 is connected to an inclination sensor 51 disposed in the roll holder 82 and controls an operation of an inclination correction device 60 correcting the inclination of the roll cleaning member 81 based on a detection result of the inclination sensor 51. The inclination correction device 60 is an output device feeding back an output of the inclination sensor 51 to the operation of correcting the inclination of the upper roll cleaning member 81a, and includes a tilt mechanism 61 connecting the roll holder 82 to the raising and lowering arm 70b and an expanding and contracting cylinder device 62 disposed between the roll holder 82 and the raising and lowering arm 70b.

The tilt mechanism 61 includes a bracket 61a fixed to the raising and lowering arm 70b, a pair of bearings 61b fixed to the roll holder 82, and a pivot 61c rotatably connecting the bracket 61a to the pair of bearings 61b. The pivot 61c penetrates the bracket 61a to be fixed to the bracket 61a. The pair of bearings 61b rotatably supports both ends of the pivot 61c. This constitutes the tilt mechanism 61 tilting the roll holder 82 about a connection center L3 of the pivot 61c.

The cylinder device 62 includes a main body 62a fixed to the raising and lowering arm 70b and a rod 62b fixed to the roll holder 82. The cylinder device 62 is an air cylinder as an actuator, and advances and retreats the rod 62b by supply and exhaust of air with respect to the main body 62a. The cylinder device 62 is disposed apart from the connection center L3 of the tilt mechanism 61 by a predetermined distance and can generate sufficient moment tilting the roll holder 82 even if a pressing force of the rod 62b is small.

As illustrated in FIG. 3, the inclination sensor 51 is disposed on a straight line L2 passing through the connection center L3 of the tilt mechanism 61 and orthogonal to the rotation axis L1 of the upper roll cleaning member 81a. According to this configuration, one inclination sensor 51 can detect whether the upper roll cleaning member 81a is inclined to the left or right. The inclination sensor 51 is, for example, an acceleration sensor, and detects the inclination of the upper roll cleaning member 81a by detecting an inclination in the direction of gravity. Incidentally, for example, the inclination sensor 51 may have such a configuration that a rotary encoder detecting a rotation angle about the pivot 61c, a distance sensor (optical sensor such as a photosensor) detecting a distance between the raising and lowering arm 70b and the roll holder 82, or the like detects the inclination of the upper roll cleaning member 81a.

Under control of the control device 72, in the above-described processing of cleaning the substrate W, before the raising and lowering device 70 brings the upper roll cleaning member 81a into contact with the substrate W (before a lowering operation M1 illustrated in FIG. 4 is performed), the inclination correction device 60 previously corrects the inclination of the upper roll cleaning member 81a based on a detection result of the inclination sensor 51 such that the rotation axis L1 of the upper roll cleaning member 81a is parallel to the upper surface W1 of the substrate W. The lowering operation M1 is an operation in which the upper roll cleaning member 81a moves from a substrate cleaning position P1 located right above the substrate W to a touchdown position P2 in contact with the upper surface W1 of the substrate W.

In order to control a roll load, it is necessary to apply a peripheral surface of the roll cleaning member perpendicularly to a surface of the substrate. Conventionally, for example, at the time of maintenance, an operator measures the inclination of a roll cleaning member using a jig such as a gap gauge and adjusts the inclination of the roll cleaning member, for example, by moving a weight attached to a roll holder. Therefore, it takes labor and time for the adjustment operation. In addition, conventionally, adjustment of the inclination of the roll cleaning member is performed manually. Therefore, it is necessary to stop an apparatus while the inclination of the roll cleaning member is adjusted.

However, in the present embodiment as described above, the inclination of the upper roll cleaning member 81a is corrected such that the rotation axis L1 of the upper roll cleaning member 81a is parallel to the upper surface W1 of the substrate W. As a result, while the upper roll cleaning member 81a held by the roll holder 82 is maintained horizontally, the upper roll cleaning member 81a is uniformly brought into contact with the upper surface W1 of the substrate W over substantially the entire length thereof such that a roll load is uniformly applied to the substrate W. Cleaning performance can be thereby improved. In addition, as a result, a repulsive force from the substrate W can be received by the entire upper roll cleaning member 81a. Therefore, in a case where a load cell is disposed in the raising and lowering arm 70b or the like, measurement accuracy of a roll load can be improved.

When the upper roll cleaning member 81a comes into contact with the upper surface W1 of the substrate W, it is preferable to connect an air supply and exhaust port connected to the main body of the cylinder device 62 to an exhaust side and to make the rod 62b free. As a result, for example, in a case where the substrate W is warped or flutters due to rotation, the tilt mechanism 61 causes the upper roll cleaning member 81a to follow the substrate W such that a roll load is uniformly applied to the substrate W. Cleaning performance can be thereby improved.

When the processing of cleaning the substrate W is completed, the raising and lowering device 70 raises the upper roll cleaning member 81a from the touchdown position P2 to the substrate cleaning position P1 (raising operation M2). Incidentally, this raising operation M2 has less concern about an impression of the substrate W onto the upper surface W1 due to the inclination of the upper roll cleaning member 81a than the lowering operation M1. Therefore, the inclination of the upper roll cleaning member 81a does not necessarily corrected.

The control device 72 operates the horizontal movement device 71 at a predetermined timing when it is necessary to clean the upper roll cleaning member 81a to move the upper roll cleaning member 81a from the substrate cleaning position P1 located right above the substrate W to the cleaning position P3 located right above the cleaning device 90. Under control of the control device 72, before the horizontal movement device 71 moves the upper roll cleaning member 81a from the substrate cleaning position P1 to the cleaning position P3 (before a horizontal operation M3 illustrated in FIG. 4 is performed), the inclination correction device 60 previously corrects the inclination of the upper roll cleaning member 81a such that the rotation axis L1 of the upper roll cleaning member 81a is parallel to a horizontal plane. As a result, the upper roll cleaning member 81a can be maintained horizontally while fluttering by the tilt mechanism 61 is suppressed. Therefore, it is possible to avoid interference with a peripheral device disposed inside the cleaning unit 31A.

When the upper roll cleaning member 81a moves to the cleaning position P3, the control device 72 operates the raising and lowering device 70 to move the upper roll cleaning member 81a from the cleaning position P3 to the touchdown position P4 in contact with the cleaning surface 90a of the cleaning device 90. Under control of the control device 72, in the above-described processing of cleaning the upper roll cleaning member 81a, before the raising and lowering device 70 brings the upper roll cleaning member 81a into contact with the cleaning device 90 (before a lowering operation M4 illustrated in FIG. 4 is performed), the inclination correction device 60 previously corrects the inclination of the upper roll cleaning member 81a such that the rotation axis L1 of the upper roll cleaning member 81a is parallel to the cleaning surface 90a of the cleaning device 90. As a result, while the upper roll cleaning member 81a held by the roll holder 82 is maintained horizontally, the upper roll cleaning member 81a is uniformly brought into contact with the cleaning surface 90a over substantially the entire length thereof such that a roll load is uniformly applied to the cleaning surface 90a. Cleaning performance can be thereby improved. Incidentally, when the upper roll cleaning member 81a comes into contact with the cleaning surface 90a, by connecting an air supply and exhaust port connected to the main body of the cylinder device 62 to an exhaust side, the rod 62b may be made free similarly to the time when a substrate is cleaned.

When the processing of cleaning the upper roll cleaning member 81a is completed, the raising and lowering device 70 raises the upper roll cleaning member 81a from the touchdown position P4 to the cleaning position P3 (raising operation M5). Incidentally, in this raising operation M5, the inclination of the upper roll cleaning member 81a is not necessarily corrected. In addition, when the upper roll cleaning member 81a moves to the cleaning position P3, the control device 72 operates the horizontal movement device 71 to move the upper roll cleaning member 81a from the cleaning position P3 located right above the cleaning device 90 to the substrate cleaning position P1 located right above the substrate W. Even before a horizontal operation M6 is performed, by correcting the inclination of the upper roll cleaning member 81a such that the rotation axis L1 of the upper roll cleaning member 81a is parallel to a horizontal plane, the upper roll cleaning member 81a can be maintained horizontally while fluttering by the tilt mechanism 61 is suppressed. Therefore, it is possible to avoid interference with a peripheral device disposed inside the cleaning unit 31A.

The inclination of the upper roll cleaning member 81a is corrected at the timing described above.

The above-described present embodiment adopts a configuration including the upper roll cleaning member 81a cleaning the substrate W, the inclination sensor 51 detecting the inclination of the upper roll cleaning member 81a, and the inclination correction device 60 correcting the inclination of the upper roll cleaning member 81a based on a detection result of the inclination sensor 51. As a result, it is possible to automate adjustment of the inclination of the upper roll cleaning member 81*a*, to shorten time adjusting the inclination of the upper roll cleaning member 81*a*, and to simplify an adjustment operation.

Hitherto, preferred embodiments of the present invention have been described and explained. However, it should be understood that these are exemplary of the present invention and should not be considered restrictively. Additions, omissions, substitutions, and other changes can be made without departing from the scope of the present invention. Therefore, the present invention should not be regarded as being limited by the above description, but is limited by claims.

For example, in the above embodiments, the inclination correction device 60 feeding back an output of the inclination sensor 51 to an inclination correction operation of the upper roll cleaning member 81*a* is exemplified as an output device outputting a detection result of the inclination sensor 51. However, the output device is not limited to this configuration. For example, the output device may be a display outputting the detection result of the inclination sensor 51 to a screen. According to such a configuration, a maintenance operator can adjust the inclination of the upper roll cleaning member 81*a* without using a jig such as a gap gauge by viewing a display on the display. Therefore, it is possible to shorten time adjusting the inclination of the upper roll cleaning member 81*a* and to simplify an adjustment operation.

In addition, for example, in the above embodiments, a form in which the inclination correction device 60 includes the tilt mechanism 61 and the cylinder device 62 is exemplified, but the inclination correction device 60 is not limited to this configuration. For example, in a case where the roll holder 82 and the raising and lowering arm 70*b* are rigidly connected to each other without the tilt mechanism 61 interposed therebetween, the inclination correction device 60 may be, for example, a slide device that is attached to the roll holder 82 or the raising and lowering arm 70*b* and slides a weight in a direction in which the raising and lowering arm 70*b* extends. According to such a configuration, by sliding the weight, the deflection amount (inclination) of the cantilever-supported raising and lowering arm 70*b* changes. Therefore, the inclination of the upper roll cleaning member 81*a* can be adjusted by the deflection amount.

In addition, for example, in the above embodiments, a form in which the inclination of the upper roll cleaning member 81*a* is adjusted has been exemplified. However, the inclination of the lower roll cleaning member 81*b* may also be adjusted by a similar configuration.

In addition, a surface of the substrate W and the cleaning surface 90*a* do not need to be horizontal planes.

In addition, for example, in the above embodiments, a configuration in which the substrate cleaning apparatus of the present invention is applied to the cleaning section 30 of the substrate processing apparatus 1 has been exemplified. However, for example, the present invention may be a single cleaning apparatus used for cleaning a substrate, and may also be applied to a cleaning section of an apparatus other than a CMP apparatus (for example, a back surface polishing apparatus, a bevel polishing apparatus, an etching apparatus, or a plating apparatus).

In addition, for example, in the above embodiments, a chemical mechanical polishing (CMP) apparatus flatly polishing a surface of the substrate W such as a silicon wafer while supplying a polishing liquid is exemplified. However, the substrate cleaning apparatus of the present invention can also be applied to a grinding apparatus grinding a back surface of the substrate W by pressing a grindstone formed by bonding diamond abrasive grains with an adhesive such as a resin bond to the back surface of the substrate W while the grindstone is rotated at high speed as an apparatus cleaning the ground or polished substrate W.

What is claimed is:

1. A substrate cleaning apparatus comprising:
a substrate holding member holding a substrate;
a roll cleaning member cleaning the substrate held by the substrate holding member;
an inclination sensor detecting an inclination of the roll cleaning member; and
an output device outputting a detection result of the inclination sensor.

2. The substrate cleaning apparatus according to claim 1, comprising, as the output device, an inclination correction device correcting the inclination of the roll cleaning member based on a detection result of the inclination sensor.

3. The substrate cleaning apparatus according to claim 2, comprising: a raising and lowering device approximating or separating the roll cleaning member with respect to the substrate, wherein
the inclination correction device previously corrects the inclination of the roll cleaning member such that a rotation axis of the roll cleaning member is parallel to a surface of the substrate before the raising and lowering device causes the roll cleaning member to be in contact with the substrate.

4. The substrate cleaning apparatus according to claim 2, comprising:
a raising and lowering device approximating or separating the roll cleaning member with respect to the substrate; and
a cleaning device cleaning the roll cleaning member, wherein
the inclination correction device previously corrects the inclination of the roll cleaning member such that a rotation axis of the roll cleaning member is parallel to a cleaning surface of the cleaning device before the raising and lowering device causes the roll cleaning member to be in contact with the cleaning device.

5. The substrate cleaning apparatus according to claim 2, comprising:
a raising and lowering device raising and lowering the roll cleaning member;
a cleaning device cleaning the roll cleaning member; and
a horizontal movement device horizontally moving the roll cleaning member between a substrate cleaning position located right above the substrate and a cleaning position located right above the cleaning device, wherein
the inclination correction device previously corrects the inclination of the roll cleaning member such that a rotation axis of the roll cleaning member is parallel to a horizontal plane before the horizontal movement device causes the roll cleaning member to move between the substrate cleaning position and the cleaning position.

6. The substrate cleaning apparatus according to claim 2, comprising:
a roll holder supporting the roll cleaning member; and
an arm suspending the roll holder, wherein
the inclination correction device includes:
a tilt mechanism connecting the roll holder to the arm; and
an expanding and contracting cylinder device disposed between the roll holder and the arm.

7. The substrate cleaning apparatus according to claim 6, wherein the inclination sensor is disposed on a straight line passing through a connection center of the tilt mechanism and orthogonal to a rotation axis of the roll cleaning member.

8. The substrate cleaning apparatus according to claim 1, wherein the inclination sensor is an acceleration sensor.

9. A substrate processing apparatus comprising:
a polishing section polishing a substrate; and
a cleaning section cleaning the substrate polished at the polishing section, wherein
the substrate processing apparatus includes, as the cleaning section, the substrate cleaning apparatus according to claim 1.

10. A substrate cleaning apparatus comprising:
a substrate holding member holding a substrate;
a roll cleaning member cleaning the substrate held by the substrate holding member;
a cleaning member holder supporting the cleaning member;
an inclination sensor detecting an inclination of the cleaning member; and
an inclination correction device outputting an outputted detection result of the inclination sensor, and moving the cleaning member holder so as to correct the inclination of the roll cleaning member based on the outputted detection result of the inclination sensor.

* * * * *